US006946668B1

(12) United States Patent
Watanabe

(10) Patent No.: US 6,946,668 B1
(45) Date of Patent: Sep. 20, 2005

(54) ELECTRON BEAM LITHOGRAPHY DEVICE AND DRAWING METHOD USING ELECTRON BEAMS

(75) Inventor: Takeshi Watanabe, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/221,669

(22) PCT Filed: Mar. 21, 2000

(86) PCT No.: PCT/JP00/01711

§ 371 (c)(1),
(2), (4) Date: Sep. 16, 2002

(87) PCT Pub. No.: WO01/71782

PCT Pub. Date: Sep. 27, 2001

(51) Int. Cl.[7] .............................. G03F 9/00; H01J 37/30
(52) U.S. Cl. .............................. 250/492.22; 250/492.1; 250/492.2; 250/492.3; 430/296; 438/14; 438/949
(58) Field of Search ........................ 250/492.22, 492.1, 250/492.2, 492.3; 430/296; 438/14, 949

(56) References Cited

U.S. PATENT DOCUMENTS

2003/0048458 A1 * 3/2003 Mieher et al. .............. 356/601
2003/0121022 A1 * 6/2003 Yoshitake et al. ............ 716/21

FOREIGN PATENT DOCUMENTS

| JP | 58-32420 | 7/1983 |
| JP | 59-139625 | 8/1984 |
| JP | 61-284921 | 12/1986 |
| JP | 5-217870 | 8/1993 |
| JP | 9-186058 | 7/1997 |
| JP | 10-189422 | 7/1998 |
| JP | 10-229047 | 8/1998 |
| JP | 11-111595 | 4/1999 |

* cited by examiner

Primary Examiner—Nikita Wells
(74) Attorney, Agent, or Firm—Dickstein Shapiro Morin & Oshinsky LLP

(57) ABSTRACT

In an electron beam lithography apparatus, when a plotting pattern is an isolated fine pattern, an exposure energy upon plotting lacks. In the prior art set forth above, dimension dependent exposure energy correction is performed as a measure, however, a problem is encountered in that excessive exposure is caused in regions where the exposure area ratio is high. The present invention solves the problem in the foregoing prior art and provides an electron beam lithography apparatus and a lithography method using an electron beam which achieves good plotting dimension accuracy even for a fine pattern plotting where regions having different exposure area ratios are present in an admixing manner. Additionally, the present invention has a construction to incorporate dimension dependent correction by taking a forward scattering diameter as a reference dimension to establish an effective backward scattering coefficient; to perform correction of an exposure energy using the effective backward scattering coefficient and an exposure area ratio.

9 Claims, 9 Drawing Sheets

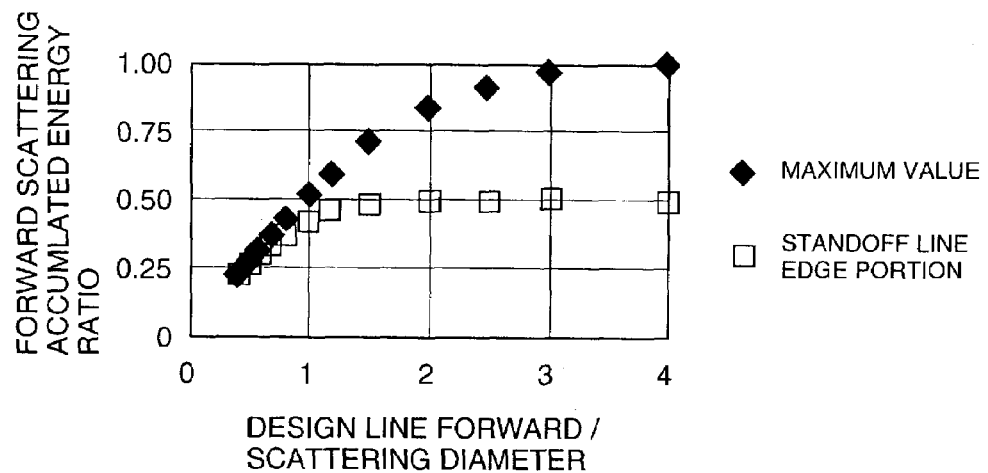
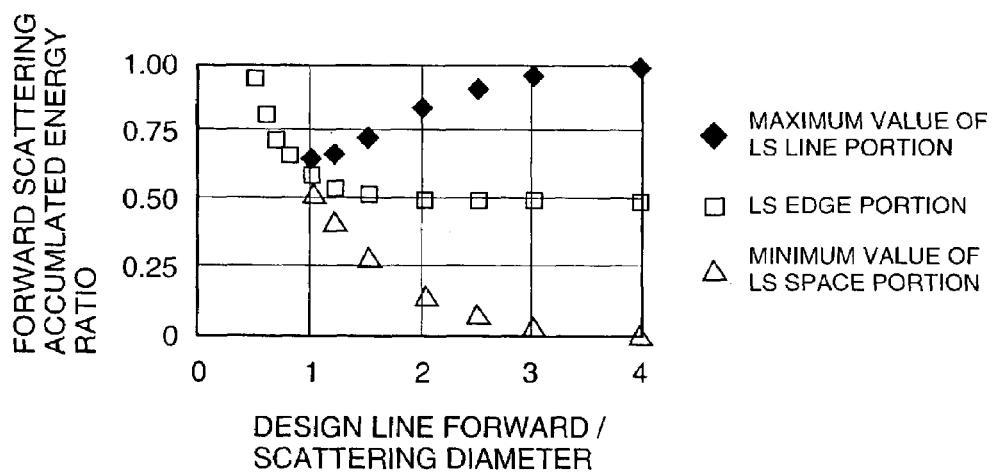

FIG. 11

VALUE OF $\eta^*$

| W/$\alpha$ | 0.5 | 0.7 | 0.8 | 1 | 1.2 | 1.5 | 2 | 2.5 | 4 |
|---|---|---|---|---|---|---|---|---|---|
| erf(W/$\alpha$) | 0.52 | 0.68 | 0.74 | 0.84 | 0.91 | 0.97 | 1 | 1 | 1 |
| $\eta=0.3$ | 1.5 | 0.92 | 0.75 | 0.54 | 0.43 | 0.35 | 0.31 | 0.3 | 0.3 |
| $\eta=0.5$ | 1.88 | 1.21 | 1.02 | 0.78 | 0.65 | 0.55 | 0.51 | 0.5 | 0.5 |
| $\eta=0.7$ | 2.27 | 1.51 | 1.29 | 1.02 | 0.87 | 0.76 | 0.71 | 0.7 | 0.7 |
| $\eta=1.0$ | 2.84 | 1.95 | 1.7 | 1.37 | 1.2 | 1.07 | 1.01 | 1 | 1 |

FIG. 12

VALUE OF $\eta^*$

| H/$\alpha$ \ W/$\alpha$ | 0.5 | 0.7 | 0.8 | 1 | 1.2 | 1.5 | 2 | 2.5 | 4 |
|---|---|---|---|---|---|---|---|---|---|
| 0.5 | 4.54 | 3.25 | 2.88 | 2.42 | 2.17 | 1.98 | 1.9 | 1.88 | 1.88 |
| 0.7 | 3.25 | 2.27 | 1.98 | 1.63 | 1.43 | 1.29 | 1.22 | 1.21 | 1.21 |
| 0.8 | 2.88 | 1.98 | 1.72 | 1.4 | 1.22 | 1.09 | 1.03 | 1.02 | 1.02 |
| 0.1 | 2.42 | 1.63 | 1.4 | 1.11 | 0.96 | 0.84 | 0.79 | 0.78 | 0.78 |
| 1.2 | 2.17 | 1.43 | 1.22 | 0.96 | 0.81 | 0.71 | 0.66 | 0.65 | 0.65 |
| 1.5 | 1.98 | 1.29 | 1.09 | 0.84 | 0.71 | 0.61 | 0.56 | 0.55 | 0.55 |
| 2 | 1.9 | 1.22 | 1.03 | 0.79 | 0.66 | 0.56 | 0.51 | 0.51 | 0.51 |
| 2.5 | 1.88 | 1.21 | 1.02 | 0.78 | 0.65 | 0.55 | 0.51 | 0.5 | 0.5 |
| 4 | 1.88 | 1.21 | 1.02 | 0.78 | 0.65 | 0.55 | 0.51 | 0.5 | 0.5 |

ELECTRON BEAM LITHOGRAPHY DEVICE AND DRAWING METHOD USING ELECTRON BEAMS

TECHNICAL FIELD

The present invention relates to an electron beam lithography apparatus and a lithography method using an electron beam for plotting very fine plotting patterns necessary for fabrication of semiconductor integrated circuits having quite high package density, by an electron beam on a substrate, such as a wafer, an exposure mask and so forth.

BACKGROUND ART

In lithography by an electron beam, it has been known to use a variable shaping type electron beam lithography apparatus, in which a sectional shape of the electron beam is shaped into a rectangular shape by passing a mask having a rectangular opening. Hereinafter, discussion will be given in terms of the variable shape type electron beam lithography apparatus.

When a plotting pattern is formed by irradiating the electron beam on a photosensitive material (hereinafter referred to as resist) on a substrate of a semiconductor wafer, exposure mask, reticle and so forth, and by chemical reaction of the resist, in addition to a primary exposure by incident electron with small scattering radius and having high resolution, there is another exposure caused by penetration of a part of the irradiated electron beam through the resist into the substrate, becoming large scatter with large scattering radius in the substrate to re-incident into the resist layer. There are two classes of irradiated electron scattering. Exposure caused by incident electron is called forward scattering. The latter having large scattering radius is called backward scattering. In a region occupied wide area by the plotting pattern, namely a region having a high exposure area ratio, excessive exposure condition can be caused by influence of backward scattering in the adjacent region to cause deformation of the plotting pattern, such as collapsing of pattern or the like. This phenomenon is generally caused by intrinsic deflection. For the measure of the intrinsic deflection, various methods for correcting exposure energy have been proposed.

One example of a correction method is to preliminarily calculate deformation due to intrinsic deflection of the plotting pattern and to preliminarily add a deformation amount compensating the deformation to data expressing the plotting pattern. A predictive calculation method of the deformation amount is complicated and not practical.

The second example is to perform lithography by adjusting the exposure energy upon plotting by canceling the exposure effect by backward scattering. This method is an exposure energy correction with taking a value defined as the exposure area ratio relative to a unit area of the plotting as indicia. When the backward scattering radius is significantly larger than the plotting pattern, influence of the backward scattering becomes substantially uniform and can be regarded to be proportional to the exposure area ratio. Consideration of adjusting exposure energy by varying the exposure period depending upon the exposure area ratio has been proposed, and has been disclosed in Japanese Patent Publication No. 58-32420, Japanese Patent Publication No. 59-139625, Japanese Patent Publication No. 61-284921 and Japanese Patent Application Laid-Open No. 10-229047, for example.

On the other hand, a method for determining the exposure energy in consideration of a dimension of the plotting pattern for enhancing effect of correction has been disclosed in Japanese Patent Application Laid-Open No. 10-189422. Also, a method for determining an auxiliary exposure pattern in consideration of the exposure area ratio and the distance of the peripheral portion of the region exposed at one time to add the exposure energy has been disclosed in Japanese Patent Application Laid-Open No. 11-111595.

Concerning exposure energy correcting method disclosed in the foregoing Japanese Patent Application Laid-Open No. 229047, discussion will be given with reference to FIG. 2. FIG. 2 is a block diagram showing a construction of a control circuit for correction of intrinsic deflection in the variable shape type electron beam lithographic apparatus.

In an auxiliary storage device (not shown) provided in the control unit 4, data of the plotting pattern is stored. Data of the plotting pattern is initially restored into independent basic pattern data by a restoring circuit (not shown) for data. Then, in a pattern decomposition circuit (not shown), the basic pattern data is decomposed into an aggregate of rectangular area pattern data smaller than a dimension of the region to be exposed during a single irradiation of the electron beam. Here, the plotting region on the substrate is defined into separate regions, each of which can be exposed by a single irradiation of the electron beam. The separated regions will be hereinafter referred to as partial regions.

Outputs from the pattern decomposition circuit are a signal indicative of an electron beam irradiation period per the partial region on the substrate, a signal indicative of longitudinal and lateral dimensions of the rectangular pattern, and a signal indicative of the position coordinates.

An irradiation period T of the electron beam, longitudinal and lateral dimensions (H, W) of the rectangular pattern, position coordinates (X, Y) of the rectangular pattern from the pattern decomposition circuit are shown in FIG. 2.

When correction for intrinsic deflection is not performed or when calculation of correction for intrinsic deflection is preliminarily performed, the irradiation period T is directly input to a blanking control circuit 1 without passing through an intrinsic deflection correcting circuit 22 to be converted into radiation/non-radiation timing signal of the electron beam.

The longitudinal and lateral dimensions (H, W) of the rectangular pattern are input to a dimension control circuit 3 and then converted into an analog signal for forming an electron beam section and input to an electron beam plotting device. The position coordinates (XC, Y) of the rectangular pattern is input to a deflection control circuit 5 to be converted into an analog signal for position deflection and then input to the electron beam plotting device.

Upon performing correction of intrinsic deflection with taking the exposure area ratio as indicia, within the radiation period T, a real time correction, in which exposure, exposure energy calculation, correcting exposure energy calculation are repeated sequentially, is executed. Then, a new irradiation period is input to the blanking control circuit 1. For correction of the irradiation period T to be performed by the intrinsic deflection correcting circuit 22, an exposure area ratio signal R per partial region calculated in an exposure area ratio calculating circuit 23 and a backward scattering coefficient $\zeta$ common to all regions are used.

Since the exposure area ratio signal R has a value varying per the partial region, they are preliminarily stored in a memory (not shown) in a form of table, in the exposure area ratio calculating circuit 23. The table is generated upon inputting the longitudinal and lateral dimensions (W, H) and position coordinates (X, Y) of the rectangular pattern.

By cumulatively adding W×H per each region with taking upper bit of the memory (not shown) storing the position coordinates (X, Y) as table coordinates, the table of the exposure area ratio can be easily generated. Subsequently, the numerical value of each region is smoothed by averaging with other numeral values of other regions of the range where the backward scattering influences to take the numeral value after smoothing as numerical value of the partial area, or other methods. The smoothing process is a setting processing of the backward scattering diameter â, and weighting in smoothing or number of times of repetition are selected depending upon the backward scattering diameter â to be set.

The exposure area ratio calculating circuit 23 performs a linear interpolation of the exposure area ratio R by position coordinates (X, Y) upon plotting, to output an interpolation value to the intrinsic deflection correcting circuit 22.

Correction calculation to be performed by the intrinsic deflection correction circuit 22 is performed in the following manner. Among the exposure energy, the energy by forward scattering will be hereinafter referred to as a plotting portion supposed forward scattering accumulated energy. Then, the amount of the plotting portion supposed forward scattering accumulation energy is assumed as one. Contribution of the forward scattering upon plotting of the plotting pattern is defined to be half of the plotting portion supposed forward scattering accumulation energy at the plotting edge.

The reason is discussed here below. A longitudinal section of the plotting pattern is considered. The exposure energy necessary for plotting the plotting pattern is assumed to be one and the exposure energy of the region around the plotting pattern is assumed to be zero, the rectangular exposure energy of 0, 1, 0 in horizontal direction in design. However, actually, in the edge portion of the plotting pattern, so-called blurring is caused. Therefore, it is not possible to abruptly vary the energy of the electron beam from zero to one and from one to zero. The beam takes a trapezoidal form having a gradient between zero and one. Accordingly, in a region of horizontal direction of the level of the energy in design, the peak portion of the wave becomes smaller and a region at the bottom of the wave, where the energy is zero, becomes larger. Upon defining the dimension in the horizontal direction of the plotting pattern of the rectangular pattern in design, dimensions are different between the peak and the bottom of the wave, in a trapezoidal manner, as set forth above. The tilted portion of the trapezoidal shape and the rectangular shape intersect at a point of ½ height. Therefore, the dimension in the horizontal direction is defined at the point of the ½ height of the trapezoidal shape, namely at the point where the energy becomes ½. With this, even when the gradient of the trapezoidal shape indicative of the exposure energy is varied, the position of the point where the height is ½, where the titled portion of the trapezoidal shape and the rectangular shape intersect, in the horizontal direction is not varied. Accordingly, by defining the actually drawn dimension, the dimension can be matched with the designed dimension of the rectangular shape.

Taking an optimal exposure period $t_{50}$ in a line and space pattern of 1:1, where the line width and line interval of the plotting pattern are the same and the exposure area ratio becomes 50%, as reference, the exposure period t can be expressed by the following equation relative to the exposure area ratio R.

$$t(R)=t_{50}\cdot(1+\eta)/(1+2\cdot\eta\cdot R) \quad (1)$$

The form of the foregoing expression (1) is to match the accumulated energy of the edge portion of the plotting pattern as set forth above, and to match the designed dimension and the plotting dimension. The reason why the reference of the optimal exposure period is taken as 1:1 line and space pattern where the exposure area ratio is 50%, is that the accumulated energy of the electron beam at the edge potion of the plotting pattern with respect to scattering of all scattering diameter in this condition constantly becomes ½ of the plotting portion supposed accumulated energy, and the plotting dimension dependency of the optimal exposure period is not present. To understand this, consider a condition where the plotting pattern is returned at the plotting edge. In this condition, across the plotting edge, one side is an entirely drawn area and the other side is a non-drawn area. However, the accumulated energy of the plotting edge portion of the 1:1 line and space pattern where the exposure area ratio is 50%, is equivalent to the edge portion of the one side entirely drawn area. Therefore, it does not depend on the plotting line width or the scattering diameter.

An electron beam scattering parameter to be used for correction of intrinsic deflection, using the foregoing exposure area ratio as indicia, is only two kinds of a backward scattering coefficient $\zeta$ as backward scattering integrated intensity versus forward scattering integrated intensity and a backward scattering diameter $\beta$. The integrated intensity of the forward scattering is only dealt as a reference of the integrated intensity of the backward scattering. The reason is that, for example, in the case that the accelerating voltage of the electron is about 50 kV, the scattering diameter of the backward scattering is about 10 $\mu$m, whereas the scattering diameter of the forward scattering is about 50 nm which is as small as less than or equal to $\frac{1}{100}$ of the former.

Taking the forward scattering as a simple reference, in case of correction method for correcting only influence of the backward scattering, with respect to a plotting pattern having a line width greater than or equal to 300 nm, relatively better correction result can be obtained. However, in case of the plotting pattern having line width less than or equal to 200 nm, in a region where the exposure area ratio is small, it becomes apparent that insufficient exposure energy can be caused at smaller line width of the plotting pattern. The reason is that an intermediate scattering having scattering diameter in the extent of 300 nm which has not be considered conventionally, cannot be ignored. In order to more accurately describe electron scattering, intermediate scattering having scattering diameter in the extent of 300 nm in description of three Gaussian distribution has to be considered.

Furthermore, when a highly sensitive chemical amplification type resist is used on the substrate, the influence becomes significant. Sensitivity of the chemical amplification type resist depends on the scattering width of acid catalyst dominant for chemical reaction and generated by irradiation of the electron beam relative to essential forward scattering, since it appears to cause expansion of the forward scattering diameter. For example, a condition to obtain ten times higher sensitivity in the chemical amplification type resist, is a condition to scatter the acid catalyst over a region of ten times in area ratio with respect to the essential forward scattering region. Since the intermediate scattering diameter is close to the forward scattering diameter and significantly different from the backward scattering diameter, it can be approximated by the forward scattering diameter. However, it has been known that the apparent forward scattering diameter at this time is expanded up to about 200 nm which is four times the conventionally supposed forward scattering diameter of 50 nm.

A reason why expansion of the effective forward scattering diameter is a problem will be discussed in terms of plotting an isolated line having a large aspect ratio and relatively distant from other plotting pattern, with reference to FIG. 3. FIG. 3 is a graph showing distribution of accumulated energy in line width direction by forward scattering upon plotting of the isolated line, (a) is the case where the plotting line width is taken as parameter, (b) shows a comparison of ideal distribution and actual distribution of the forward scattering accumulated energy ratios when the plotting line width is double the forward scattering diameter, and (c) shows a comparison of ideal distribution and actual distribution of the forward scattering accumulated energy ratios when the plotting line width is equal to the forward scattering diameter. Here, a position x/α is a position in a unit standardization with the effective forward scattering diameter α and the value of plotting edge is assumed as 0. On the other hand, the forward scattering accumulated energy ratio is a ratio of forward scattering accumulated energy at the position x/α and supposed accumulated energy of the plotting portion.

In FIG. 3(a), when the line width w of the plotting pattern is greater than double the effective forward scattering diameter α, for example, when line width w/α= 4.0, as shown by an asterisk mark *, the accumulated energy ratio at the supposed plotting edge of the position x/α=0 constantly becomes half of the supposed accumulated energy of the plotting portion at the position of x/α=2. In contrast to this, when the line width of the plotting pattern becomes smaller in relation to the effective forward scattering diameter α, the electron beam accumulated energy at the plotting edge is lowered to be smaller than half of the supposed accumulated energy of the plotting portion at the position of x/α=2, and the accumulated energy at the center of the line width of the plotting pattern is also lowered. This condition will be discussed with reference to FIGS. 3(b) and 3(c).

When the line width w of the plotting pattern is double the effective forward scattering diameter α, in FIG. 3(b), a distribution of the accumulated energy by forward scattering electron, shown by the white diamond shape of sign ◇, becomes smaller than the ideal wave shape distribution, shown by the white square of sign □. However, the forward scattering accumulated energy ratio at the supposed plotting edge at the position x/α=0 and the electron beam accumulated energy at the supposed plotting edge is half of the plotting portion supposed accumulated energy, the line width by the distribution of the accumulated energy and the line width in design are matched. Accordingly, in plotting of this pattern, supposed line width can be obtained without correction as shown by black square of sign ■.

On the other hand, when the plotting line width w is equal to the effective forward scattering diameter α, in FIG. 3(c), the position where the plotting portion supposed accumulated energy becomes half becomes inside of line width than the supposed plotting edge at the position of x/α=0 and the electron beam accumulated energy does not make plotting impossible. When plotting is performed without correction, insufficient exposure energy makes the line thinner than the line width w/α= 1.

Furthermore, when the plotting line width is thin, as shown by black diamond of sign ◆ of FIG. 3(a), the region where the plotting portion supposed accumulated energy is half is not present to make it impossible to perform plotting per se.

This condition is shown aggregatingly in FIG. 4. FIG. 4 is a graph showing plotting line width dependency of the forward scattering accumulated energy ratio showing plotting line width dependency of the accumulated energy by the forward scattering electron at the plotting center and the plotting edge portion upon plotting of the isolated line, in which a horizontal line represents a ratio versus the forward scattering diameter of the design line width. In FIG. 4, when the plotting dimension becomes smaller than double the effective forward scattering diameter, the electron beam accumulated energy of the designed edge portion of the line form plotting pattern is lowered to place the position where the forward scattering accumulated energy ratio is 0.5, namely the position where the plotting portion supposed accumulated energy becomes half, is located inside of the plotting line width to cause thinning of the line width with respect to the design dimension of the line width. Furthermore, when the plotting dimension is about equal to the effective forward scattering diameter, the peak value of the electron beam accumulated energy also becomes less than or equal to half of the plotting portion supposed accumulated energy to make image formation per se impossible. These conditions are exemplified in plotting of w/α=1.0 and w/α=0.5 in FIG. 3.

Therefore, upon fine dimension plotting, it becomes necessary to perform exposure energy adjustment depending upon plotting dimension. Desired correction is the correction to make the forward scattering accumulated energy ratio of the edge portion of the isolated line 0.5 without depending upon the plotting dimension as shown in FIG. 9.

Exposure energy adjustment depending upon the plotting dimension as set forth above has been discussed in Japanese Patent Application Laid-Open No. Heisei 10-189422. By performing correction as set forth above, the distribution of the forward scattering accumulated energy ratio corresponding to FIG. 3(a) is as shown in FIG. 5(a). In comparison with FIG. 3(a), the accumulated energy ratio is increased.

FIG. 5(b) shows distribution of the forward scattering accumulated energy ratio upon plotting correction when the plotting line width w is equal to the effective forward scattering diameter α, similarly to FIG. 3(a) to permit plotting as supposed. On the other hand, FIG. 5(c) shows distribution of the forward accumulated scattering accumulated energy ratio upon plotting correction in the case where the plotting line width w is half of the effective forward scattering diameter α. However, even in this case, plotting as supposed can be performed.

In the prior art disclosed in Japanese Patent Application Laid-Open No. Heisei 10-189422, the need for exposure energy adjustment depending upon plotting dimension is attributed to insufficient exposure energy due to insufficient accuracy in dimension measurement. Namely, in the prior art, the same correction is applied irrespective of the exposure area ratio. In this correction, a problem is newly encountered in that over-dosing is caused in line and space pattern where the exposure area ratio is 50% or in the plotting pattern of high exposure area ratio where the interval between lines is smaller than the line width to cause collapse of the pattern.

FIGS. 6 and 7 are graphs showing the forward scattering accumulated energy distribution similarly to FIG. 3 or 5, and show the case of line and space pattern plotting. The discussion given hereinafter shows only the influence of the effective forward scattering and does not include influence of the backward scattering. However, in practice, since the accumulated energy due to backward scattering electron which can be regarded as substantially constant, is added, a wider line width than the result set forth later is drawn.

In the line and space pattern of the exposure area ratio being 50% where the ratio between the line width and the interval there between is 1:1, the value of the electron beam accumulated energy at the plotting edge before exposure energy correction constantly becomes half of the plotting portion supposed accumulated energy irrespective of the plotting dimension. In contrast to this, when correction for the isolated thin line disclosed in the prior art and the same line width dependent correction are added to this pattern, the electron beam accumulated energy is increased to cause over-dosing as shown in FIG. 7, and the plotting area shown by the black square of sign ■ becomes wider in comparison with the case of FIG. 6 to cause thickening of the dimension.

This phenomenon is shown in FIG. 8. FIG. 8 shows over-dosing to be caused in line and space pattern where the exposure area ratio is 50% and the ratio between the line width and the interval therebetween is 1:1. FIG. 8 is a graph showing the dependency of plotting line width on the forward scattering accumulated energy ratio. The horizontal axis represents a ratio of the designed line width versus the forward scattering diameter. In FIG. 8, when the line width dependent correction required for plotting the isolated thin line is performed for the line and space pattern where the ratio between the line width and the interval therebetween is 1:1, over-dosing can be caused at higher frequency at smaller plotting pattern as shown in FIG. 8.

In the prior art set forth above, the example of plotting of the line and space pattern shown in FIGS. 6, 7 and 8 only shows influence of the effective forward scattering and does not include influence of the backward scattering. However, in practice, the accumulated energy due to backward scattering electron which can be regarded substantially constant, is added. Therefore, since resolution of the fine pattern of line and space of 1:1 is difficult from the beginning, a pattern where the line interval is wider than the drawn line width is drawn in practice. However, even in this case, when the drawn line width and the line interval become smaller, in the correction method by the foregoing prior art, pattern collapsing where thickening of the line dimension and coupling of the lines, can be caused.

SUMMARY OF INVENTION

In the electron beam plotting apparatus, lacking of the exposure energy in plotting is caused when the plotting pattern to be drawn is isolated fine pattern. In the foregoing prior art, as a measure for this, exposure energy correction depending upon dimension is performed. However, a problem is encountered to cause excessive exposure in the region where an exposure area ratio is high.

The present invention has been worked out for solving the problems in the prior art. Therefore, an object of the present invention is to provide an electron beam lithography apparatus and a lithography method employing an electron beam, in which matching of a line width dependent correction for making correction corresponding to a forward scattering diameter and an exposure area ratio dependent correction as correction corresponding to a backward scattering coefficient and achieves high plotting dimension precision even for a fine pattern where regions having different exposure area ratios are present.

The present invention has a construction to incorporate dimension dependent correction with taking forward scattering diameter $\alpha$ as a reference dimension to establish an effective backward scattering coefficient $\eta^*$, and to perform correction of an exposure energy with the effective backward scattering coefficient $\eta^*$ and an exposure area ratio R.

More particularly, in an embodiment of the present invention, (1) an electron beam lithography apparatus dividing an exposure pattern into a rectangular shape of a size less than or equal to a maximum shot size, and the divided rectangular patterns being sequentially exposed on a substrate by a rectangular electron beam, wherein exposure is performed with adjusting intensity of the exposure with a preliminarily set correction parameter with respect to a longitudinal dimension and a lateral dimension of the rectangular pattern to be exposed and a ratio of an area to be exposed versus a reference area of a region on the substrate.

Furthermore, adjustment of the exposure energy is performed by classifying both dimension of the rectangular pattern dimensions with the same reference, generating a correction parameter table corresponding to dimensional class in both directions and performing correction with performing plotting by irradiation of the electron beam with reference to the correction parameter table and the exposure area ratio table of plotting area to enable real time correction.

On the other hand, experimentarily determining the adjustment of the exposure energy per fine dot of pattern corresponding to the correction parameter table is not practical for complexity of large data amount. Therefore, (3) the correction pattern depending upon the plotting pattern depending upon the plotting pattern width and the plotting pattern length of each plotting pattern facilitates setting of the correction parameter, with taking the correction parameter determined with taking classification dimension in relation to one reference dimension for a plurality of dimensional classes, as an intermediate parameter.

For realizing this, (4) when scattering of electron in electron beam lithography is described by two Gaussian distributions, the reference dimension is a scattering diameter of the forward scattering as one of Gaussian distributions having narrower distribution, the correction parameter is determined with respect to non-dimensional plotting dimension as converted with reference to the forward scattering diameter.

The foregoing Gaussian distribution is effective depending upon resist processing condition. On the other hand, the scattering diameter to be the reference dimension is an effective value depending upon the resist processing condition and is input as correction parameter. According to one aspect of the present invention, the dependency of the resist processing condition relating to correction depending upon plotting dimension is set in a form varying the effective forward scattering diameter.

In the embodiment of the present invention, furthermore, (5) converted dimension with the reference dimension is taken as correction parameter determined with taking the error function as intermediate parameter. Here, consideration is given for the case of plotting the isolated pattern where the width in x direction is W and height in y direction is H. The accumulated energy due to forward scattering at a corner portion of the plotting pattern is given by integrating the scattering distribution function from 0 to W for x and integrating from 0 to H for y. When the forward scattering is described by Gaussian distribution, this can be utilized the fact that it can be described by the product of the error function.

When the correction parameter is given irrespective of the exposure area ratio, over-dosing can be caused in the region where the exposure area ratio is high as set forth above to cause collapsing of the pattern. Therefore, in the embodiment of the present invention, (6) in adjustment of the foregoing exposure energy, a construction is taken so as not to effect correction even in the case where one of the dimensions of the rectangular pattern to be exposed is less than or equal to a preliminarily set dimension for the line and space pattern of a ratio of the line width and line interval is 1:1 where the exposure area ratio is 50%.

The embodiment of the present invention applies plotting dimension dependent correction for the backward scattering coefficient instead of direct exposure energy correction depending upon plotting dimension. Then, dimension dependent correction continuous to the conventional correction method for large dimension plotting can be realized.

Accordingly, an apparatus constructed in accordance with the present invention (7) may include:

an exposure area ratio calculating circuit dividing a graphic pattern to be plotted obtained from a basic plotting graphic pattern into a plurality of partial region in advance of plotting on a substrate and calculating an exposure area ratio for respective of divided partial regions to store in storage means, a scattering coefficient correction calculation circuit calculating correction for a backward scattering coefficient expressed by preliminarily given 2-Gaussian distribution approximation with respect to large dimension pattern of the size greater than or equal to a predetermined size and unnecessary to correct with respect to class of width and length of the graphic pattern to be plotted in advance of plotting on the substrate, and providing an effective backward scattering coefficient depending upon plotting dimension, an intrinsic deflection correction circuit performing intrinsic deflection correction for an exposure period with reference to an exposure area ratio per each partial region read out for the storage means of the exposure area ratio calculating circuit and the effective backward scattering coefficient per the graphic pattern to be plotted output from the backward scattering coefficient correction calculation circuit, and an electron beam plotting device irradiating an electron beam on the substrate on the basis of the exposure period corrected by the intrinsic deflection correction circuit for plotting the graphic pattern to be plotted.

BRIEF DESCRIPTION OF THE DRAWINGS

FIG. 4 is a graph showing a plotting line width dependency of a forward scattering accumulated energy ratio at a plotting center and plotting edge portion;

FIG. 8 is a graph showing a plotting line width dependency of the forward scattering accumulated energy ratio of the case where the line width dependent correction the same as that upon isolated line plotting is applied to the line and space pattern plotting;

FIG. 11 is a table showing an example of setting an effective backward scattering coefficient $\eta^*$ upon fine line plotting; and FIG. 12 is a table showing an example of setting of an effective backward scattering coefficient $\eta^*$ upon rectangular shape plotting in the case where true backward scattering coefficient $\zeta$ is 0.5.

BEST MODE FOR IMPLEMENTING THE INVENTION

Embodiments of the present invention will be discussed hereinafter.

Figure 9:
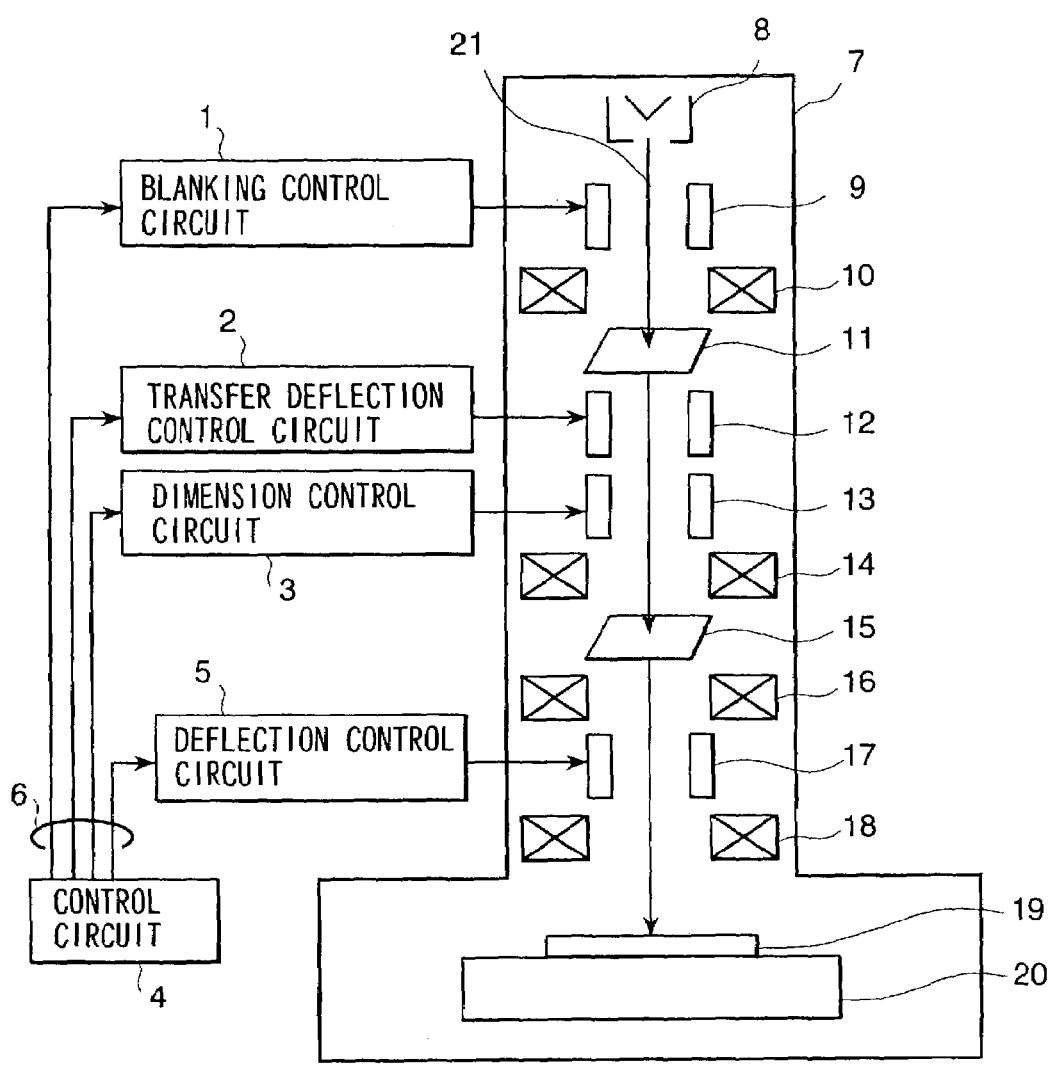
FIG. 9 is an illustration generally showing a construction of a variable shaping type electron beam lithography apparatus.

FIG. 9 is an illustration generally showing a construction of a variable shaping type electron beam lithography apparatus. A column 7 is shown by a longitudinal section.

An electron beam 21 drawn from an electron source 8 passes through an electron-optical lenses unit constituted of shaping lens 10 and 14, a reducing glass 16 and a projecting lens 18, to be irradiated on a substrate 19 loaded on an X-Y stage 20. Furthermore, on a light axis of the electron beam 21, a rectangular opening mask 11 is provided for shaping the electron beam 21 into a rectangular shape. On the other hand, on the light axis of the electron beam 21, an exposure mask 15 is provided to shape the electron beam 21 into a desired shape. In order to control the electron beam 21, a blanking electrode 9 for turning ON-OFF of irradiation, a blanking control circuit 1 for controlling a current for the blanking electrode, a transfer deflection control circuit 2 controls a transfer deflection electrode 12 performing selection of partial collective pattern provided in the exposure mask 15 and a current therefor, a dimension control circuit 3 for controlling a shaping deflection electrode 13 controlling a size of the electron beam upon rectangle plotting and a current therefor, and a deflection control circuit 5 for controlling a position deflection electrode 17 for controlling plotting position on the substrate 19 and a current therefor, are provided. These control circuits 1, 2, 3 and 5 are connected through signal line 6 and are controlled by a control unit 4 including a computer.

Upon performing rectangle plotting the rectangular electron beam is guided to a large rectangular opening portion in the exposure mask 15 by means of the transfer deflection electrode 12, and then overlapping between opening on the rectangular opening mask 11 and large rectangular opening on the exposure mask 15 is adjusted for performing plotting. In case of plotting of the partial collective pattern, selection of the partial collective pattern is performed by deflecting the rectangular-shaped electron beam 21 to the transfer deflection electrode 12 to guide to a desired pattern on the exposure mask 15.

Next, a principle of exposure energy correction by the present invention. An accumulated energy intensity distribution EID(r) of the scattering electron is expressed by the following expression described by 2-Gaussian distribution, taking the forward scattering integrated intensity as 1:

$$EID(r)=(1/\pi)\{1/\alpha^2\}exp(-r^2/\alpha^2)+(\eta/\beta^2)exp(-r^2/\beta^2) \quad (2)$$

wherein the first item of the foregoing equation (2) is the Gaussian distribution of the forward scattering, and the second item is the Gaussian distribution of the backward scattering. $\alpha$ is the forward scattering diameter and $\beta$ is the backward scattering diameter, $\eta$ is the backward scattering coefficient defined by integrated intensity ratio of the backward scattering, taking the forward scattering as reference.

While the foregoing equation (2) is expressed in terms of the distance r, in a polar coordinate form, it can be converted into xy coordinate form utilizing a relationship of $r^2=x^2+y^2$. Namely, a portion relating to the forward scattering is in a form of the following expression.

$$(1/\pi)\cdot(1/\alpha^2)\cdot exp(-r^2/\alpha^2)= (1/\pi)\cdot(1/\alpha^2)\cdot exp(-x^2/\alpha^2)\cdot exp(-y^2/\alpha^2) \quad (3)$$

Accordingly, by taking the forward scattering diameter $\alpha$ as reference dimension, behavior of forward scattering can be uniformly known.

Considering condition for plotting the isolated pattern having the width W in x direction and height H in y direction, the accumulated energy in forward scattering of the corner portion in the plotting pattern is given by integrating the equation (3) from 0 to W in terms of x and from 0 to H in terms of y, which can be described by a product of error function. Accordingly, the former integration becomes half of error function value erf(W/a) concerning W/$\alpha$, and the latter integration becomes half of error function value erf(H/$\alpha$) concerning (H/$\alpha$).

Here, the error function erf(a) provides an integrated value of the following Gaussian distribution function G(t) from 0 to a, and a function having a nature to be about 1 when a is greater than 2.

$$G(t)=(2/\sqrt{\pi})\cdot exp(-t^2) \quad (4)$$

Dimension dependent correction for the isolated pattern may be done by correcting lowering of the error function value erf(a) caused when the integration upper limit a becomes smaller than 2. Therefore, correction of the exposure energy for the isolated pattern may be done by correcting the exposure energy given for a large size pattern by way of dividing with two error functions erf(W/$\alpha$) and erf(H/$\alpha$).

On the other hand, when the plotting pattern is relatively large and dimension dependent correction is not necessary, correction for influence of backward scattering may be required, and intrinsic deflection correcting equation of equation (1) can be used as set forth above. The equation (1) is for establishing matching of the designed dimension and the plotted pattern by matching the accumulated energy at the edge portion of the plotting pattern irrespective of the plotting dimension. At this time, contribution of the forward scattering is formulated under the premise that the electron beam accumulated energy at the plotting edge is constantly half of the plotting portion supposed accumulation energy. This may be premised that the plotting dimension is constantly double or more of the forward scattering diameter. In the equation (1), assuming R=0, as shown by the following equation, an optimal exposure period to upon isolated pattern plotting, in which exposure area ratio can be approximated, is obtained.

$$t_0=t_{50}°(1+\eta) \quad (5)$$

However, upon plotting of the isolated pattern where the plotting dimension is less than or equal to double of the forward scattering diameter $\alpha$, for matching the accumulated energy at the edge portion of the plotting pattern with the pattern of greater than or equal to double of the forward scattering diameter a, the optimal exposure period $t_0$ upon isolated pattern plotting has to be made the following equation representative of the plotting dimension dependency.

$$t_0(W, H)=t_0/erf(W/\alpha)/erf(H/\alpha) \quad (6)$$

Since $t_{50}$ in the foregoing equation (5) does not have plotting dimension dependency in principle, the correction equation of the foregoing equation (1) may be extended for the case where the plotting dimension is less than or equal to double the forward scattering diameter $\alpha$ with consistency when the backward scattering coefficient $\eta$ effectively depends on the plotting dimension as in the following equation.

$$1+\zeta(W, H)=(1+\eta)/erf(W/\alpha)/erf(H/\alpha) \quad (7)$$

Accordingly, the correction equation of the equation (1) is modified into a plotting dimension depending equation in a form of the following equation.

$$t(R, W, H)=t_{50}\{1+\eta(W, H)\}/\{1+2\cdot\eta(W, H)\cdot R\} \quad (8)$$

This correction equation makes the exposure period longer when the plotting pattern size (W, H) becomes smaller in the region where the exposure area ratio R is smaller than 0.5. However, when the exposure area ratio R is 0.5, correction is not effected even when the plotting pattern size is small. On the other hand, it is the dimension dependent correction equation continuous to the conventional intrinsic deflection correcting method for large dimension plotting. The present invention is realized by the following embodiment on the foregoing principle of correction.

Figure 2:
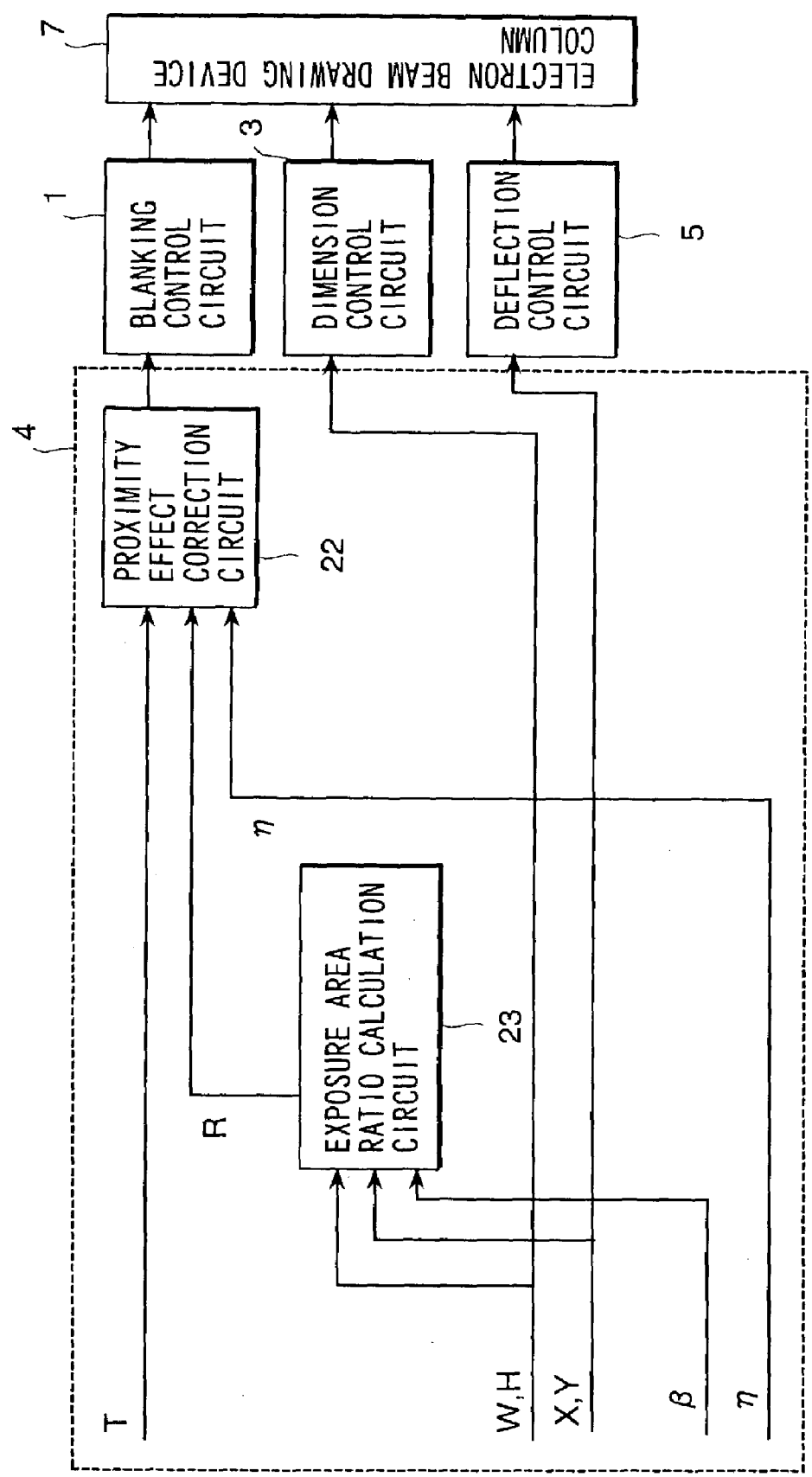
FIG. 2 is a block diagram showing a construction of a control circuit for intrinsic deflection correction.
Figure 3:
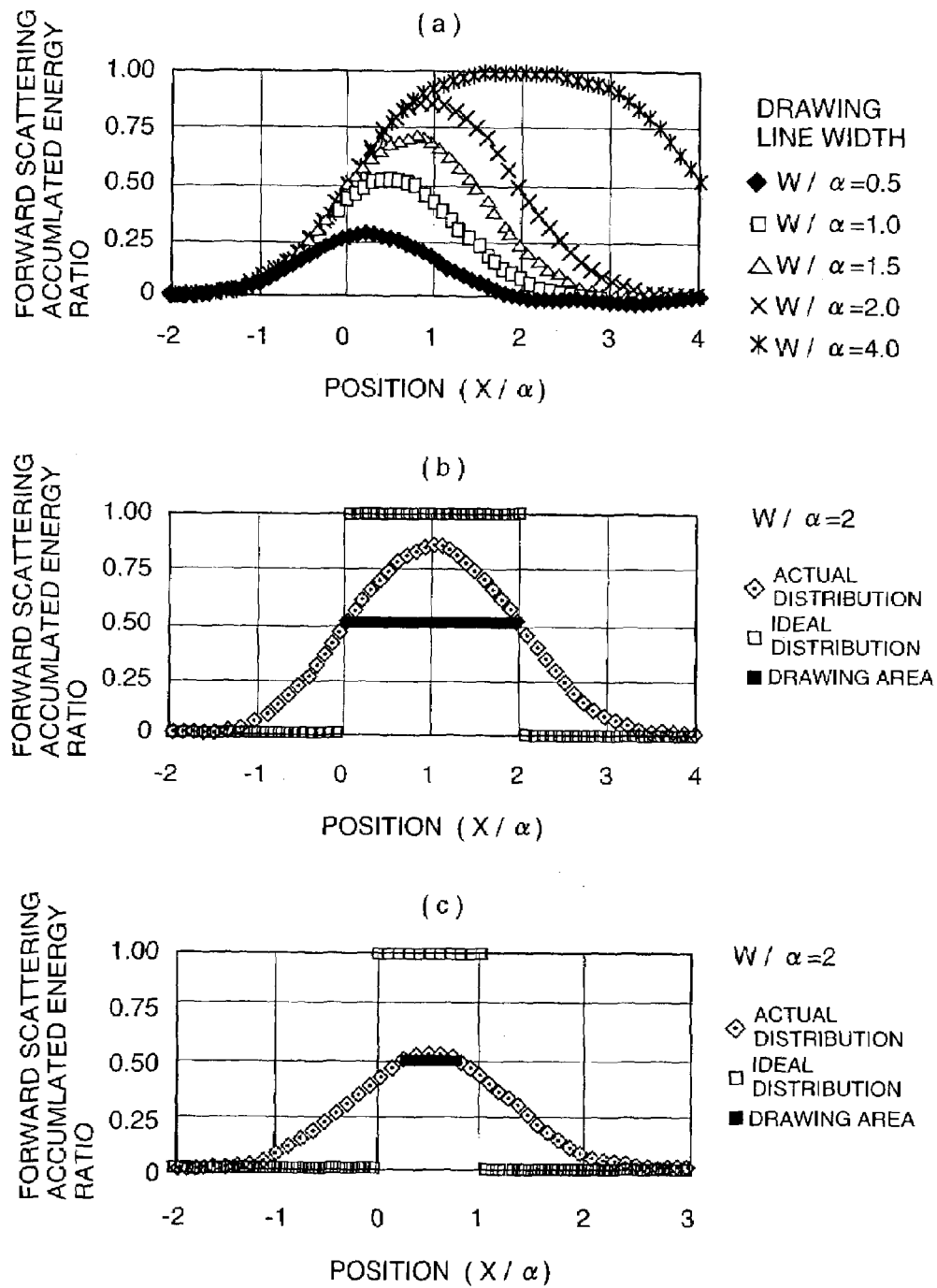
FIG. 3 is a is a graph showing a distribution in line width direction of an accumulated energy due to forward scattering upon isolated line plotting.
Figure 5:
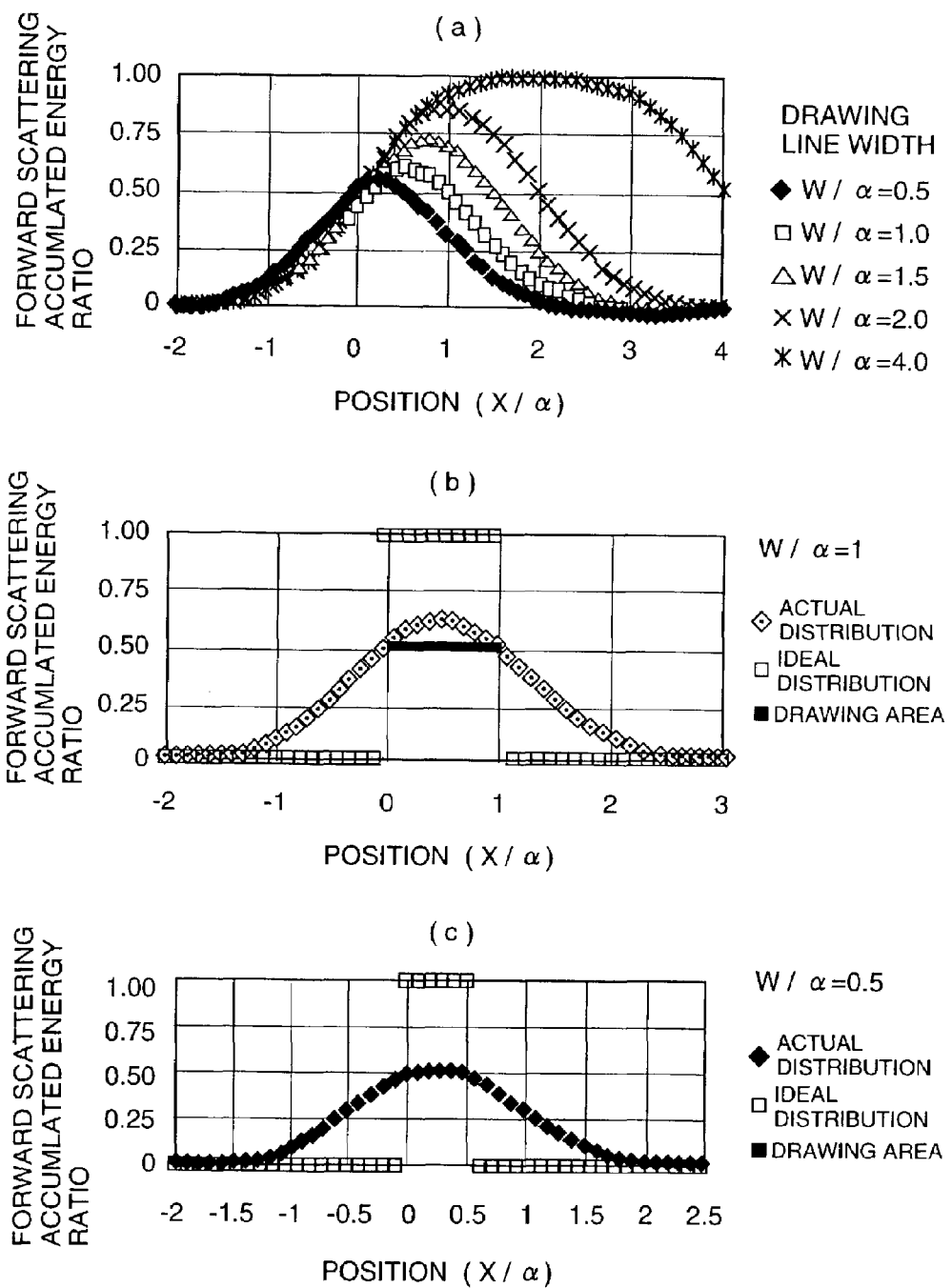
FIG. 5 is a graph showing a distribution of a forward scattering accumulated energy in the case where dimension dependent correction is effective for isolated line plotting.
Figure 6:
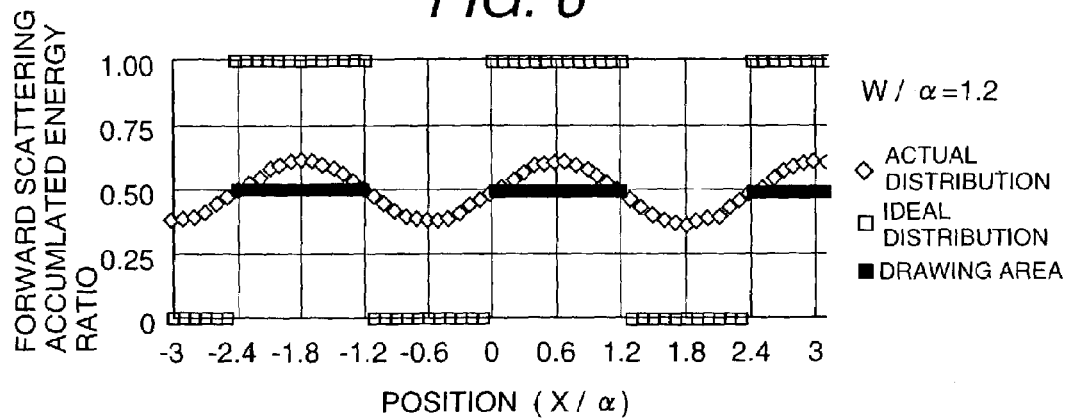
FIG. 6 is a graph showing a distribution of the forward scattering accumulated energy upon a line and space pattern plotting.
Figure 7:
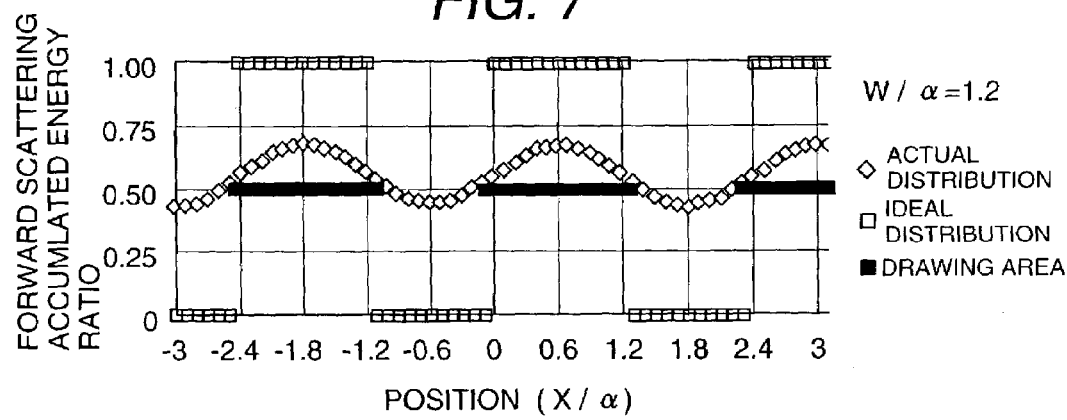
FIG. 7 is a graph showing the forward scattering accumulated energy distribution where the line width dependent correction the same as that upon isolated line plotting is applied to the line and space pattern plotting.
Figure 10:
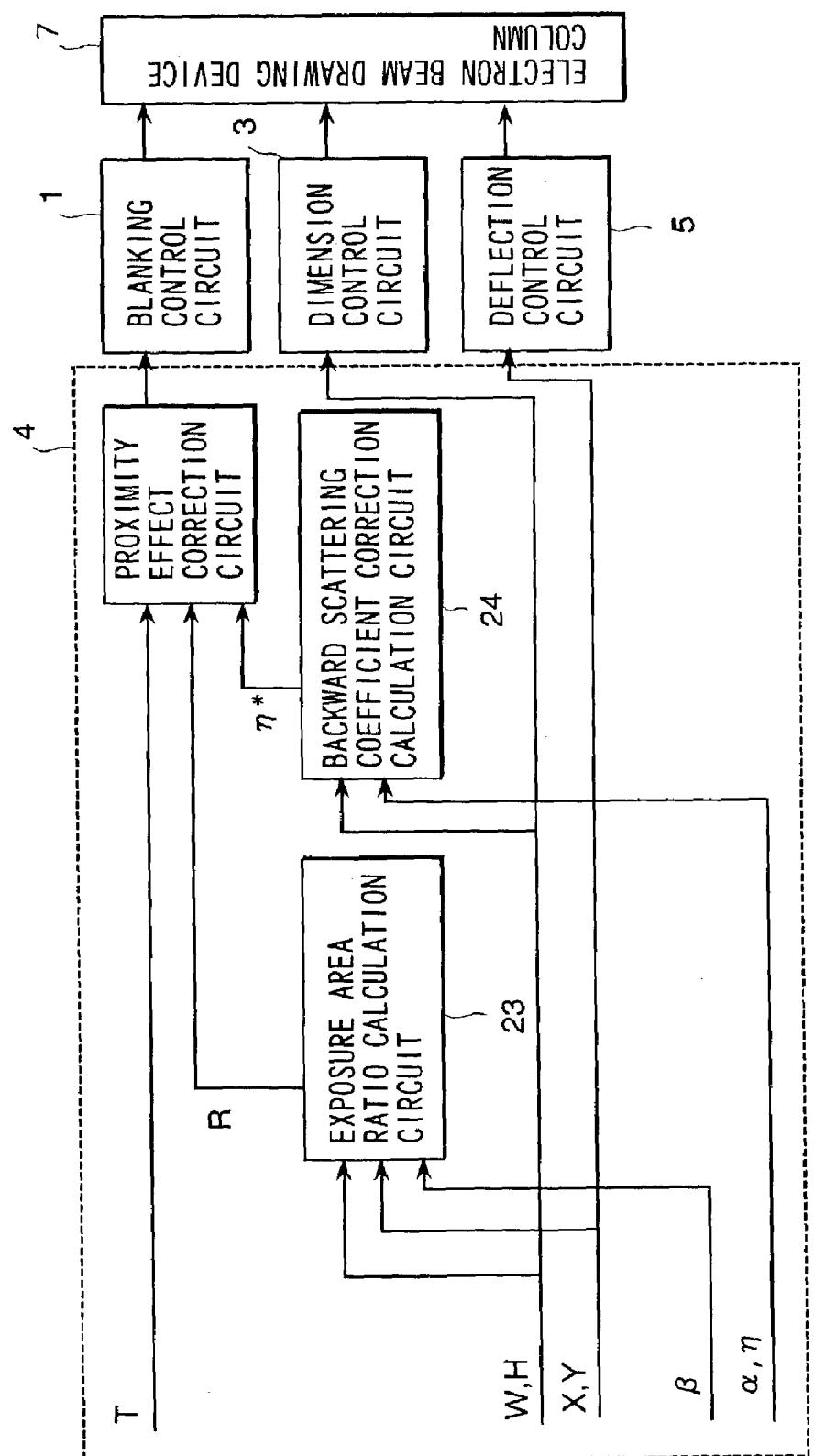
FIG. 10 is a block diagram showing a construction of a control circuit for performing an intrinsic deflection correction and a plotting dimension dependent correction in the variable shaping type electron beam lithography apparatus.

FIG. 10 is a block diagram showing a construction of a control circuit for adding plotting dimension dependent correction to the intrinsic deflection correction in the variable shape type electron beam lithography apparatus in FIG. 2.

Signs in the drawing are common to FIG. 2, wherein T denotes an electron beam irradiation period from a pattern decomposing circuit (not shown)m (W, H) denotes a longitudinal and lateral dimension of the rectangular pattern, and (X, Y) denote position coordinates. The irradiation period T is finally input to the blanking control circuit 1 and is converted into irradiation/non-irradiation timing signal of the electron beam. The longitudinal and lateral dimensions (W, H) of the rectangular pattern are input to the dimension control circuit 3 to be converted into an analog deflection signal for forming the electron beam section. The position coordinate (X, Y) is input to the deflection control circuit 5 to be converted into an analog signal for position deflection. Then, respective signal is input to the electron beam plotting device column 7 to be used for control of the electron beam.

To the blanking control circuit 1, a corrected signal effected a real time correction, in which exposure and exposure energy correction are performed repeatedly, for the irradiation period T in actual plotting, by the intrinsic deflection correcting circuit 22, is input. The corrected signal is derived by the exposure area ratio R per partial region by dividing the plotting region and an effective backward scattering coefficient $\eta^*$ calculated by a backward scattering coefficient correction calculating circuit 24. The effective backward scattering coefficient η* takes the plotting pattern size dependency into the backward scattering coefficient η.

Since the exposure area ratio R is difference for each divided partial region, it is preliminarily stored in a memory (not shown) in the form of a table in the exposure area ratio calculating circuit 23. This table is generated upon inputting the longitudinal and lateral dimension (W, H) and position coordinates (X, Y) of the rectangular pattern.

The exposure area ratio table can be easily generated by taking the upper bit of the memory (not shown) storing the position coordinates (X, Y) as table coordinates and cumulating values of the product of W and H per region. Subsequently, the values in respective regions are smoothed by averaging with values of other regions in a range where the backward scattering is extended and other method, to take the value after smoothing as the value of the partial region. This smoothing process is a setting process of the backward scattering diameter, and weighting and repetition times of smoothing may be selected depending upon the backward scattering diameter β to be set.

Then, the exposure area ratio calculating circuit 23 performs linear interpolation of the exposure area ratio R by position coordinates (X, Y) upon plotting to output an interpolated value to the intrinsic deflection correcting circuit 22.

A feature of the illustrated embodiment is that the backward scattering coefficient input to the intrinsic deflection correcting circuit 22 is taken as effective value η* containing the plotting pattern size dependency. The correction calculation is performed by the backward scattering coefficient correction calculation circuit 24.

To the backward scattering coefficient correction calculation circuit 24, the forward scattering diameter α, the backward scattering coefficient, the longitudinal and lateral dimensions (W, H) and the position coordinates (X, Y) of the rectangular pattern are input. The longitudinal and lateral dimensions (W, H) are input in real time and the forward scattering diameter α and the backward scattering coefficient η are preliminarily stored in the memory (not shown) in advance of plotting.

The backward scattering coefficient calculating circuit 24 has a function for classifying the longitudinal and lateral dimension (W, H) of the plotting pattern into "less than L1, more than equal to L(1) and less than L(2), . . . , more than or equal to L(n)". Here, with taking the maximum classification of classification where the longitudinal and lateral dimensions (W, H) are greater than or equal to a predetermined value, as no correction condition upon plotting dimension dependent correction, for each classified longitudinal and lateral dimension (W, H), typical dimensions "L0, L1, . . . , Ln" are preliminarily added. With establishing matching between each typical dimension and pattern decomposing condition, no problem will be arisen by number of class being small.

Furthermore, the backward scattering coefficient correcting calculation circuit 24 has a function for calculating error function values "erf(L0/α), erf(L1/α), . . . , erf(Ln/α)" for the foregoing typical dimension and the forward scattering diameter α and storing as table. Here, the error function erf(a) gives a value derived by integrating Gaussian distribution function G(t) of the foregoing equation (4) from 0 to a, and is about 1 when a is greater than 2.

Figure 1:
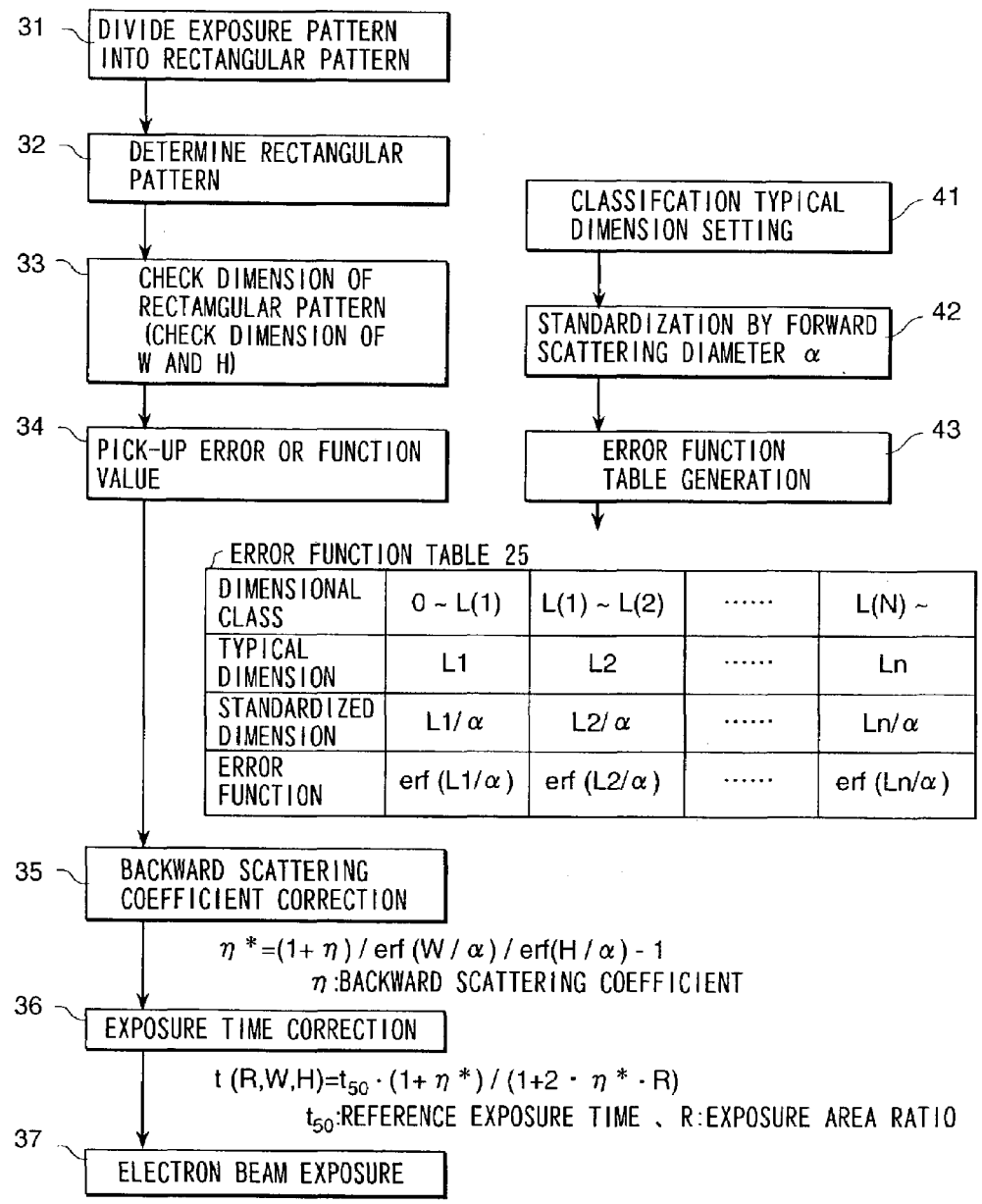
FIG. 1 is a flowchart showing a function of the present embodiment mainly constituted of a backward scattering coefficient correction calculating circuit 24.

FIG. 1 is a flowchart showing a function of the shown embodiment taking the backward scattering coefficient correction calculation circuit 24 as a primary component. After rectangular division of the exposure pattern at step 31 and determination of the rectangular pattern at step 32, check of rectangular dimension is executed at step 33.

At step 34, at a timing plotting actually, pick-up of the error function value depending upon class of the longitudinal and lateral dimension (W, H) of the rectangular pattern is executed.

The error function table 25 is generated at step 43 after setting the typical dimension for the class at step 41 and standardizing by the forward scattering diameter α at step 42.

At step 35, correction calculation for the backward scattering coefficient η is executed. Namely, effective backward scattering coefficient η* is calculated by the following equation (9).

$$\eta^* = (1+\zeta)/erf(W/\alpha)/erf(H/\alpha) - 1 \qquad (9)$$

Here, it is also possible that correction calculation is preliminarily executed in advance of correction and the table of the effective backward scattering coefficient η* for the plotting dimension class is generated for correction with reference to the table upon plotting. This table will be discussed with reference to FIGS. 11 and 12.

At step S36, exposure period correction is executed using an equation (10) given later, and at step 37, exposure by the electron beam is executed.

Correction employing the effective backward scattering coefficient η* shown in the equation (9) is equivalent for the longitudinal and lateral dimension (W, H). When both of the longitudinal and lateral dimensions are small, greater correction is applied than the case where only one of longitudinal and lateral dimensions is small. This is because the error function erf(a) is about 1 when a is greater than 2. On the other hand, owing to the nature of the error function, when both the longitudinal and lateral dimensions W and H are large, the effective backward scattering coefficient η* matches the true backward scattering coefficient in this correction equation. Accordingly, the correction method in the illustrated embodiment is not limited to fine patterns. It is possible to apply the correction method to all patterns to be plotted.

FIG. 11 is a table showing an example of setting an effective backward scattering coefficient η* upon fine line plotting, and showing variation of the effective backward coefficient set value depending upon the forward scattering relative to the true backward scattering coefficient and plotting line width. On the other hand, FIG. 12 is a table showing an example of setting an effective backward scattering coefficient η* upon rectangular shape plotting in the case where the true backward scattering coefficient ζ is 0.5, and showing variation of the effective backward coefficient set value depending upon the forward scattering relative to be plotting regular size.

In FIG. 11, the effective backward scattering coefficient η* is set in line plotting of the line width W/α with reference to the forward scattering diameter α when the true backward scattering coefficients ζ are 0.3, 0.5, 0.7 and 1.0. When W/α is greater than or equal to 2. The effective backward scattering coefficient η* substantially equal to the true backward scattering coefficient η is set, and the value greater than the true backward scattering coefficient η is set as the effective backward scattering coefficient η*.

FIG. 12 indicate the value of the set effective backward scattering coefficient η* in rectangular plotting of the width W and height H when the true backward scattering coefficient is 0.5. When both of the line widths W/α and H/α are greater than or equal to 2, the effective backward scattering coefficient η* substantially equal to the true backward scattering coefficient is set. When one of the line width W/α and the line width H/α becomes smaller than 2, the value greater than the true backward scattering is set as the effective backward scattering coefficient η*. However, when both of the line widths W/α and H/α are smaller than 2, further greater value is set as the effective backward scattering coefficient η*.

The foregoing process up to outputting of the effective backward scattering coefficient η* is the function of the backward scattering coefficient correction calculating circuit 24 shown in FIG. 10.

The intrinsic deflection correction circuit 22 shown in FIG. 10 performs the intrinsic deflection correcting calculation of the exposure period T with reference to the effective backward scattering coefficient η* and the divided exposure area ratio R per partial region from the exposure area ratio calculating circuit 23, in real time. This correction is defined by the following equation with reference to the optimal exposure period $t_{50}$ in the line and space pattern where the exposure area ratio is 50%.

$$t(R, W, H) = t_{50}(1+\eta^*)/(1+2\cdot\eta^*\cdot R) \qquad (10)$$

This correcting equation is the same as the case of the equation (1) where the plotting dimension dependent correction is not present formally. However, since the plotting dimension dependency is reflected in the effective backward scattering coefficient η* from the foregoing equation (9), the exposure period becomes long in the partial region where the exposure area ratio R is smaller than 0.5 when the plotting pattern size (W, H) becomes small. In this correction equation, when the exposure area ratio R is 0.5, even when the plotting pattern size is small, correction depending upon the plotting dimension dependency is not applied. Furthermore, upon large dimension pattern plotting, since the effective backward scattering coefficient η* matches the true backward scattering coefficient η, it becomes available correction equation for all plotting patterns.

Correction by the embodiment of the present invention set forth above will be summarized as follows in view point of function.

(1) The longitudinal and lateral dimensions (W, H) of the plotting pattern are classified.

(2) The typical dimension L0, L1, . . . Ln is given for each class.

(3) The error function value of the value derived by dividing each typical dimension by the forward scattering diameter α is stored as the table.

(4) With reference to the table value depending upon both dimensions of longitudinal and lateral plotting pattern, the backward scattering coefficient η is corrected.

(5) The exposure energy correction is executed so as not to apply dimension dependent correction in the exposure area ratio 50%.

It is also possible that without effecting real time correction, (4) may be implemented by preliminarily establishing a table by calculation and making reference to the table value of the value of the effective backward scattering coefficient η* depending upon pattern dimension upon plotting.

It should be noted that, in the embodiment of the present invention set forth above, one example in the variable shape type electron beam lithography apparatus has been discussed for avoiding confusion, the invention can be adapted for partial collective pattern lithography method. When the present invention is applied to the partial collective pattern lithography method, for the partial collective pattern lithography information, the exposure area ratio R and information relating to the minimum pattern dimension (W, H) may be added as additional information. Then, upon partial collective plotting, plotting is performed with reference to these additional information. With this method, the present invention becomes applicable for apparatus and method for the partial collective pattern lithography.

With the embodiment of the present invention as set forth above, upon plotting a pattern having less than or equal to 200 nm of line width on the substrate, it becomes possible to accurately correct the plotting pattern size dependency of the exposure energy. Accordingly, high accuracy lithography of fine pattern of less than or equal to 200 nm of line width can be realized without causing lowering of productivity of the electron beam lithography apparatus.

On the other hand, the plotting pattern size dependency of the optimal exposure energy appears in the greater pattern size when high sensitivity chemical amplification type resist is used in high sensitivity condition. Therefore, it has been difficult to achieve both of the use of the chemical amplification type resist under high sensitivity condition and plotting accuracy of find dimension. With the embodiment of the present invention, it becomes possible to use the chemical amplification type resist under a highly sensitive condition to enhance productivity of the electron beam lithography apparatus.

As set forth, with the present invention, remarkable effect is achieved in that in the electron beam lithography apparatus, the problems where the exposure energy lacks upon plotting when the plotting pattern is isolated fine pattern, and when the exposure energy correction depending upon dimension is performed, excessive exposure is caused in the region where the exposure area ratio is high, can be resolved. Thus, an electron beam lithography apparatus and method can achieve plotting dimension accuracy even for fine pattern plotting where regions have different exposure area ratios. Thus, the present invention is quite effective.

What is claimed is:

1. An electron beam lithography apparatus dividing an exposure pattern into a rectangular shape of a size less than or equal to a maximum shot size, and said divided rectangular patterns being sequentially exposed on a substrate by a rectangular electron beam, comprising:

a scattering coefficient correction calculation circuit setting a preliminary set correction parameter for a longitudinal dimension and a lateral dimension of said rectangular pattern to be exposed, an exposure area ratio calculating circuit for setting a ratio of an area exposed for a reference area of a region on said substrate, an intrinsic deflection correcting circuit for adjusting said exposure energy on the basis of the correction parameter set by said scattering coefficient correction calculation circuit and the ratio of the area to be exposed relative to the reference area set by said exposure area ratio calculating circuit, and an electron beam plotting device column performing exposure on the basis of an intensity of exposure adjusted by said intrinsic deflection correcting circuit.

2. An electron beam lithography apparatus as set forth in claim 1, wherein in said exposure area ratio calculating circuit, an exposure area ratio table is generated from the ratio of area to be exposed relative to said reference area with respect to each region on said substrate, in said intrinsic deflection correcting circuit, the longitudinal dimension and lateral dimension of said rectangular pattern is classified by the same reference and generates a correction parameter table corresponding to classification of both dimensions, and the exposure energy is adjusted with reference to said correction parameter table and said exposure area ratio table.

3. An electron beam lithography apparatus as set forth in claim 2, wherein said correction parameter to be set by said scattering coefficient correction calculation circuit is a correction parameter to be determined with taking the classification dimension relative to one reference dimension for a plurality of said classes as an intermediate parameter.

4. An electron beam lithography apparatus as set forth in claim 3, wherein said reference dimension is a scattering diameter expressed by one of Gaussian distribution of narrower scattering as scattering of electron within said substrate as expressed by two Gaussian distributions.

5. An electron beam lithography apparatus as set forth in claim 2, wherein said correction parameter set by said scattering coefficient correction calculation circuit is a correction parameter determined with taking an error function taking a converted dimension as converted by one reference dimension for a plurality of said classes as parameter, as an intermediate parameter.

6. An electron beam lithography apparatus as set forth in claim 1, wherein, in said intrinsic deflection correction circuit, said exposure energy is corrected for line and space patterns other than that having a ratio of area to be exposed versus said reference area set by exposure area ratio calculation circuit being 50%.

7. An electron beam lithography apparatus comprising:
   an exposure area ratio calculating circuit dividing a graphic pattern to be plotted obtained from a basic plotting graphic pattern into a plurality of partial region in advance of plotting on a substrate and calculating an exposure area ratio for respective of divided partial regions to store in storage means,
   a scattering coefficient correction calculation circuit calculating correction for a backward scattering coefficient expressed by preliminarily given 2-Gaussian distribution approximation with respect to large dimension pattern of the size greater than or equal to a predetermined size and unnecessary to correct with respect to class of width and length of the graphic pattern to be plotted in advance of plotting on said substrate, and providing an effective backward scattering coefficient depending upon plotting dimension,
   an intrinsic deflection correction circuit performing intrinsic deflection correction for an exposure period with reference to an exposure area ratio per each partial region read out from said storage means of said exposure area ratio calculating circuit and the effective backward scattering coefficient per said graphic pattern to be plotted output from said backward scattering coefficient correction calculation circuit, and
   an electron beam plotting device irradiating an electron beam on said substrate on the basis of the exposure period corrected by said intrinsic deflection correction circuit for plotting said graphic pattern to be plotted.

8. An electron beam lithography apparatus exposing a plotting pattern by irradiating an electron beam onto a substrate, comprising:
   correction means dividing said substrate into a plurality of partial area and correcting an exposure energy for exposing said plotting pattern on the basis of an area occupied by the plotting pattern in said partial region, and longitudinal and lateral dimensions and line width of the plotting pattern in said partial region.

9. An electron beam lithography apparatus as set forth in claim 8, wherein a correction amount of said exposure energy is derived from an effective backward scattering coefficient taking longitudinal and lateral dimension of the plotting pattern in said partial region as a parameter with taking a radius of forward scattering to be generated by irradiation of said electron beam onto said substrate and deriving from an effective backward scattering coefficient derived from a backward scattering coefficient based on said parameter and a ratio of area to be occupied by the plotting pattern in said partial region.

* * * * *